(12) United States Patent
Bao et al.

(10) Patent No.: US 9,419,586 B2
(45) Date of Patent: Aug. 16, 2016

(54) DEVICE FOR NEGATIVE GROUP DELAY

(75) Inventors: Mingquan Bao, Vastra Frolunda (SE); Yu Su, Gothenburg (SE)

(73) Assignee: TELEFONAKTIEBOLAGET LM ERICSSON (publ), Stockholm (SE)

( * ) Notice: Subject to any disclaimer, the term of this patent is extended or adjusted under 35 U.S.C. 154(b) by 10 days.

(21) Appl. No.: 14/419,452

(22) PCT Filed: Aug. 7, 2012

(86) PCT No.: PCT/EP2012/065438
§ 371 (c)(1),
(2), (4) Date: Feb. 3, 2015

(87) PCT Pub. No.: WO2014/029412
PCT Pub. Date: Feb. 27, 2014

(65) Prior Publication Data
US 2015/0207491 A1 Jul. 23, 2015

(51) Int. Cl.
| H03H 7/30 | (2006.01) |
| H03H 11/26 | (2006.01) |
| H03F 1/22 | (2006.01) |
| H03F 3/193 | (2006.01) |

(Continued)

(52) U.S. Cl.
CPC ............... *H03H 11/26* (2013.01); *H01P 5/12* (2013.01); *H03F 1/22* (2013.01); *H03F 3/193* (2013.01); *H03F 3/601* (2013.01); *H03F 3/608* (2013.01); *H03H 7/32* (2013.01); *H03H 11/04* (2013.01); *H01P 1/38* (2013.01); *H03F 2200/108* (2013.01); *H03F 2200/181* (2013.01); *H03H 5/12* (2013.01)

(58) Field of Classification Search
CPC .............. H03H 7/30; H03H 11/26; H03F 3/60
USPC ........ 333/214, 109, 112, 116, 117, 120, 24 R, 333/165
See application file for complete search history.

(56) References Cited

U.S. PATENT DOCUMENTS

| 4,189,682 A | 2/1980 | Sechi |
| 5,146,177 A | 9/1992 | Katz et al. |

(Continued)

FOREIGN PATENT DOCUMENTS

| KR | 20140028274 A | * | 3/2014 | ................ H03F 1/52 |
| WO | WO 2012050257 A2 | * | 4/2012 | ............ H03F 1/3229 |

OTHER PUBLICATIONS

PCT International Search Report, mailed May 2, 2013, in connection with International Application No. PCT/EP2012/065438, all pages.

(Continued)

*Primary Examiner* — Dean Takaoka
(74) *Attorney, Agent, or Firm* — Leffler Intellectual Property Law, PLLC

(57) ABSTRACT

A negative group delay circuit comprising a negative group delay component, also comprising a circulator with three ports, further comprising a first resonator, with the negative group delay component arranged between an input port of the negative group delay circuit and a first port in the circulator. The first resonator is arranged between a second port of the circulator and a first reflection amplifier, so that signals reflected from the first reflection amplifier to the second port of the circulator through the first resonator are emitted at the third port of the circulator. The third port is arranged to be used as an output port of the negative group delay circuit.

2 Claims, 16 Drawing Sheets

(51) Int. Cl.
*H03F 3/60* (2006.01)
*H03H 7/32* (2006.01)
*H01P 5/12* (2006.01)
*H03H 11/04* (2006.01)
*H03H 5/12* (2006.01)
*H01P 1/38* (2006.01)

(56) References Cited

U.S. PATENT DOCUMENTS

| | | | |
|---|---|---|---|
| 6,072,376 A * | 6/2000 | Matsuyoshi | H01P 1/2053 330/124 R |
| 6,603,956 B1 | 8/2003 | Shin | |
| 2001/0026200 A1 | 10/2001 | Rhodes et al. | |
| 2005/0127996 A1 * | 6/2005 | Jelonnek | H03F 1/3229 330/151 |
| 2015/0099478 A1 * | 4/2015 | Wyville | H03H 11/344 455/114.3 |
| 2016/0093958 A1 * | 3/2016 | Mortazawi | H01Q 21/06 330/144 |

OTHER PUBLICATIONS

PCT Written Opinion, mailed May 2, 2013, in connection with International Application No. PCT/EP2012/065438, all pages.

International Preliminary Report on Patentability, mailed Aug. 15, 2014, in connection with International Application No. PCT/EP2012/065438, all pages.

Takeda, S. et al. "Phase equalizer making use of negative group delay times by reflection coefficients", IEEE 2011 41st European Microwave Conference, Oct. 10, 2011, pp. 627-630, XP032072988, ISBN: 97-1-61284-235-6.

Choi, H. et al. "A design of size-reduced negative group delay circuit using a stepped impedance resonator" Proceedings of IEEE 2010 Microwave Conference, Dec. 7, 2010, pp. 1118-1121, XP031928796, ISBN: 97-1-4244-7590-2.

* cited by examiner

DEVICE FOR NEGATIVE GROUP DELAY

TECHNICAL FIELD

The present invention discloses an improved negative group delay circuit.

BACKGROUND

In microwave communications systems and components, a linear phase response, i.e. so called consistent group delay, and a flat amplitude response are necessary in order to keep the waveform of signals transmitted through or by the system or component. Without consistent group delay and flat amplitude response, distortion will occur in the waveform, resulting in inter-symbol interference.

For example, in ultra-wideband, UWB, applications, consistent group delay is a highly important issue, since UWB systems use impulse signals to transmit information, and variations in group delay may cause fatal errors.

Another area of technology where group delay is also highly important is wideband power amplifier design.

Variations in group delay mainly originate from amplifiers, filters and load miss-matching in the system or component. In a typical low-pass or band-pass filter, it can be found that the main group delay variations occur near the edge of the pass band, i.e. in "transition areas" of the filter. Such group delay variations need to be compensated for. In order to accomplish this compensation, different technologies have been used: in analog systems, especially at microwave frequencies, all-pass networks are usually used to generate positive group delay signals, i.e. the opposite of negative group delay.

As an alternative to IIR and FIR filters, negative group delay (NGD) circuits can be used in order to suppress the group delay which increases near the edge of the pass-band of a low-pass or band-pass filter, without changing group delay in other ranges.

If all-pass networks are used in order to equalize group delay, passive components with a high quality factor, Q, are necessary, since otherwise a large attenuation would occur at resonance frequencies. Typically, the Q factor for "lumped components" in such solutions should be larger than 300, which is a very high value, particularly in monolithic microwave integrated circuit, MMIC, technology. Also, a single all-pass network has a limited frequency bandwidth and group delay variation, so in order to cover an entire pass-band, several cascaded all-pass networks with different center frequencies would be needed.

If a negative group delay circuit is used for equalizing group delay, a single stage circuit is usually enough to compensate for the group delay increases which occur at the edge of the pass-band. Unfortunately, a large attenuation in magnitude cannot be avoided, which has to be compensated for, usually by means of amplifiers. However, the gain increase obtained by using amplifiers is not limited to the frequency range where the negative group delay occurs, which is obviously undesired.

SUMMARY

It is an object of the invention to alleviate at least some of the disadvantages mentioned above of conventional group delay compensation technology. This object is achieved by means of a negative group delay circuit which comprises a negative group delay component.

The negative group delay circuit also comprises a circulator with three ports, and the negative group delay circuit further comprises a first resonator.

The negative group delay component is arranged between an input port of the negative group delay circuit and a first port in the circulator. In addition to this, the first resonator is arranged between a second port of the circulator and a first reflection amplifier which is also comprised in the negative group delay circuit. In this manner, signals reflected from the first reflection amplifier to the second port of the circulator through the first resonator are emitted at the third port of the circulator. The third port of the circulator is arranged to be used as an output port of the negative group delay circuit.

In embodiments of the negative group delay circuit, the circulator is a three-port microwave circulator.

In embodiments of the negative group delay circuit, the circulator comprises a 90° hybrid with an input port, an isolated port, a direct port and a coupled port. The direct port and the coupled port are connected to respective resonators, with each resonator being connected in series with respective reflection amplifiers, so that the combination of these two ports acts as one port in the circulator.

BRIEF DESCRIPTION OF THE DRAWINGS

The invention will be described in more detail in the following, with reference to the appended drawings, in which.

DETAILED DESCRIPTION

Figure 1:
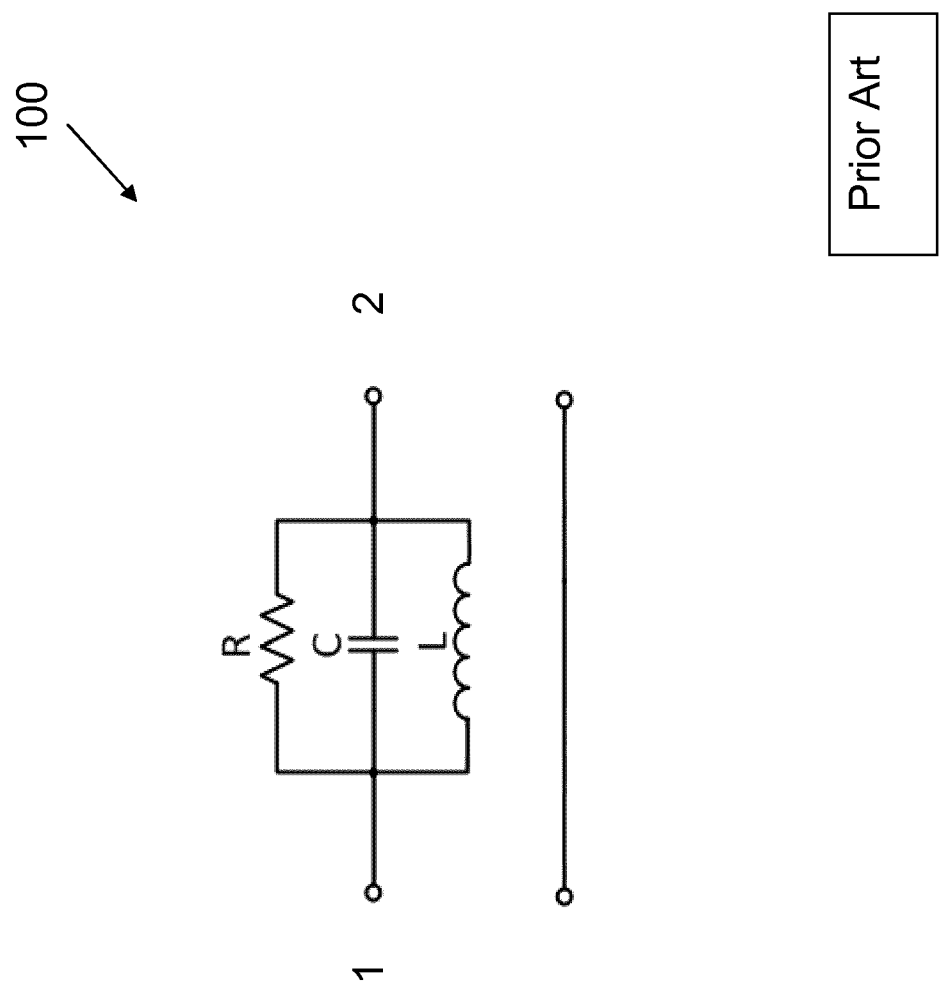
FIG. 1 shows a prior art negative group delay circuit.

Embodiments of the present invention will be described more fully hereinafter with reference to the accompanying drawings, in which embodiments of the invention are shown. The invention may, however, be embodied in many different forms and should not be construed as being limited to the embodiments set forth herein. Like numbers in the drawings refer to like elements throughout.

The terminology used herein is for the purpose of describing particular embodiments only, and is not intended to limit the invention.

Figure 2:
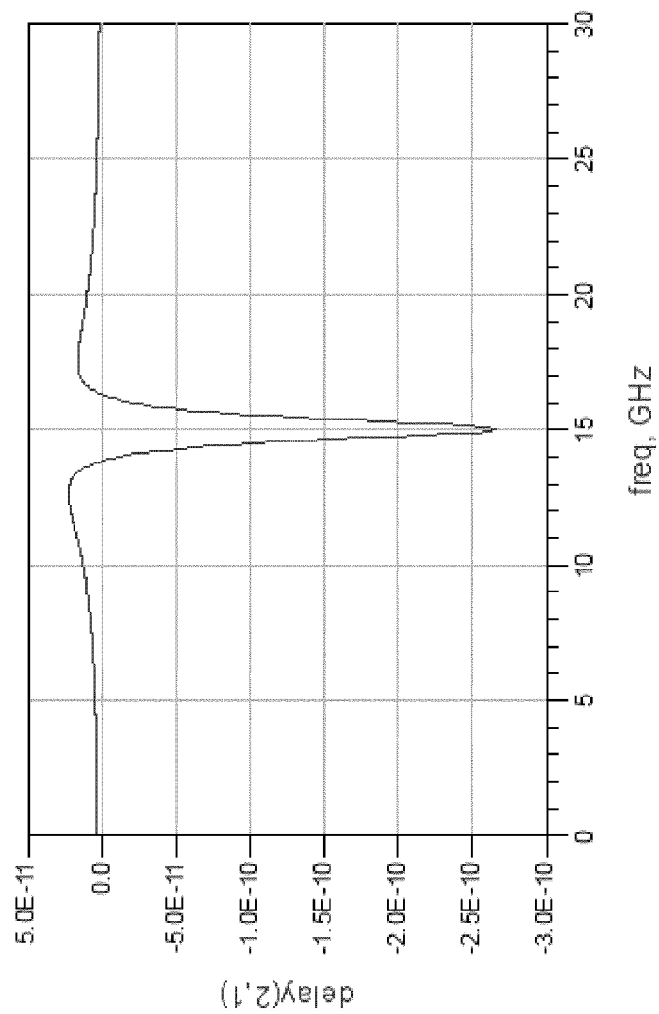
FIGS. 2 and 3 show performance graphs of the prior art circuit of FIG. 1.
Figure 3:
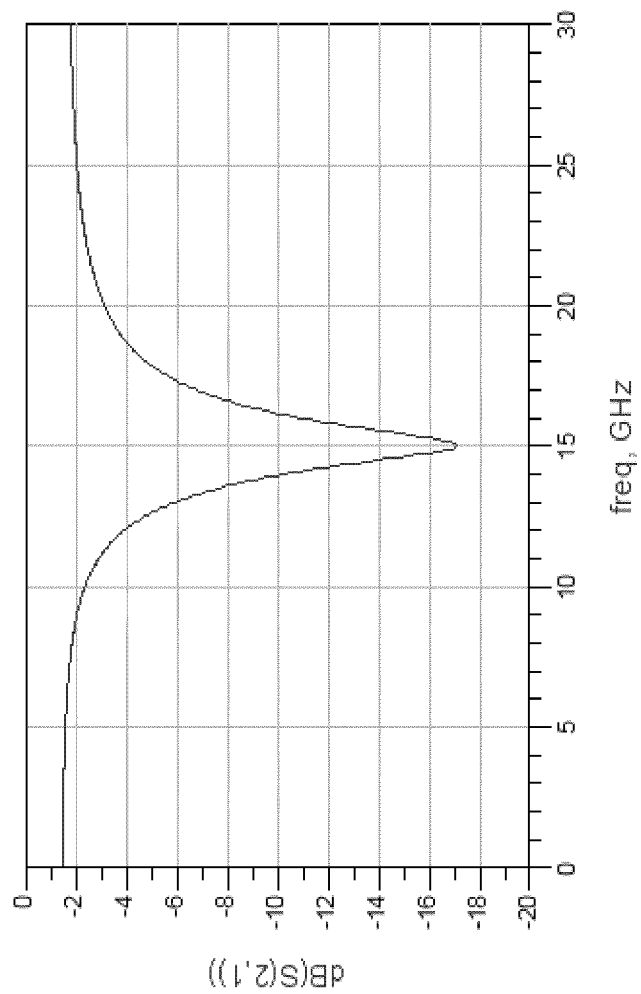

In order to enhance the understanding of the invention, a prior art negative group delay circuit will briefly be described first, with reference to FIGS. 1-3: in FIG. 1, an example of a prior art negative group delay circuit 100 is shown. This negative group delay circuit 100 is a two port-circuit, with the two ports being shown as 1 and 2 in FIG. 1. The negative group delay circuit 100 comprises an inductor L, a capacitor C and a resistor R coupled in parallel to each other, as seen from port 1.

Using L=0.23 nH, C=0.49 pF and R=327Ω for the circuit of FIG. 1, FIGS. 2 and 3 show performance graphs of the circuit 100 of FIG. 1. FIG. 2 shows the delay between the ports 1 and 2, and FIG. 3 shows the corresponding gain.

As can be seen in FIG. 2, there is a sharp drop in group delay at around 15 GHz, and as shown in FIG. 3, this is accompanied by a drop in gain of about 16 dB at the same frequency.

Figure 4:
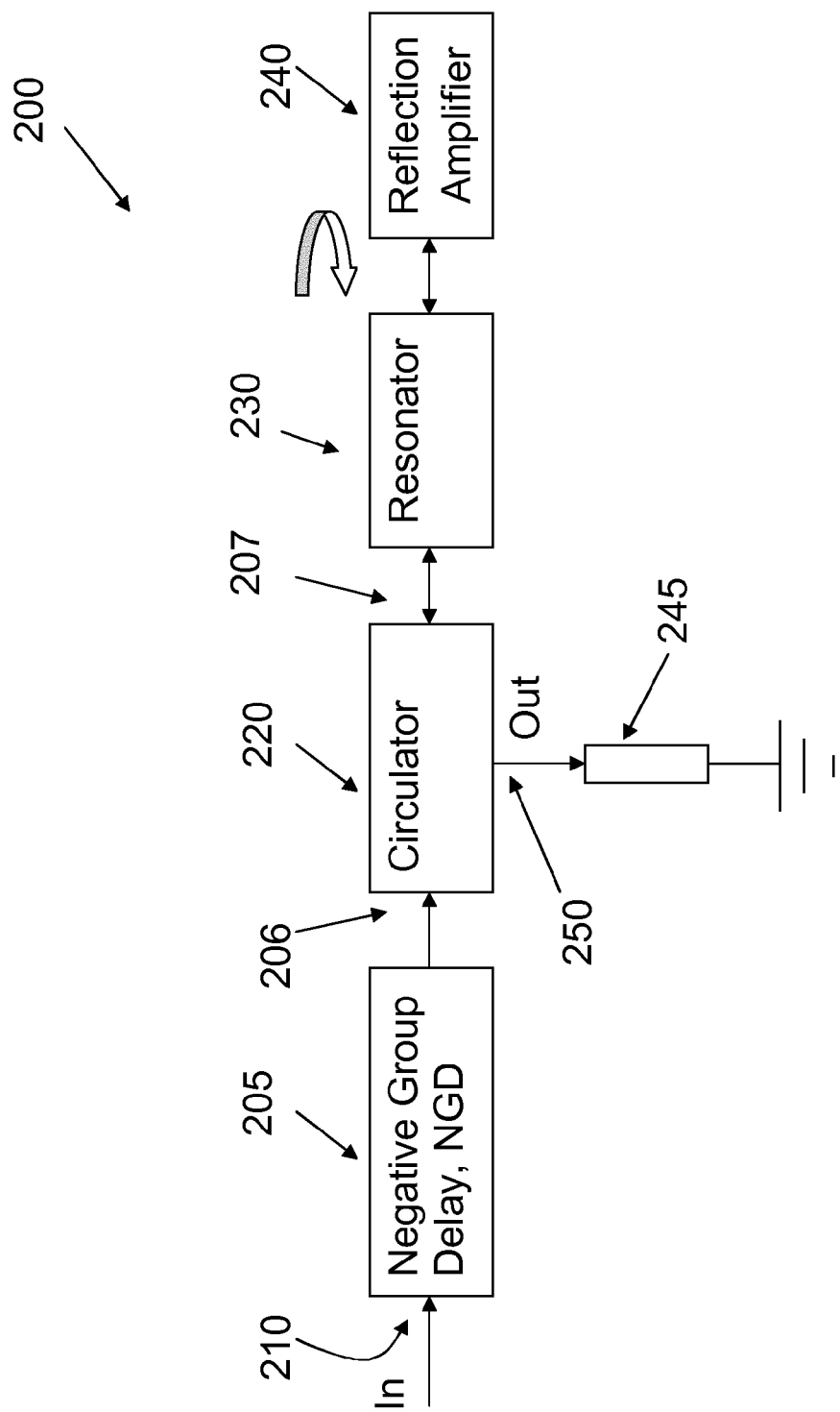
FIG. 4 shows a block diagram of a negative group delay circuit.

FIG. 4 shows an embodiment of a negative group delay circuit 200 of the invention. As shown in FIG. 4, the negative group delay circuit 200 comprises a negative group delay component 205, examples of which will be shown later in this text.

In addition to the negative group delay component 205, the negative group delay circuit 200 also comprises a circulator 220 with three ports 206, 207, 250. One property of a circulator such as the one 220 is that a signal which "enters" (i.e. is input at) one of the ports 206, 207, 250 is transmitted to the "next" port, in a known order. In the embodiment of FIG. 4, signals entering the port 206 of the circulator 220 are transmitted to the port 207, and signals entering the port 207 are transmitted to the port 250.

The negative group delay component 205 is arranged between an input port 210 of the entire negative group delay circuit 200 and the port 206 of the circulator 220. Thus, input signals to the negative group delay circuit 200 will pass through the negative group delay component 205, into the circulator at port 206, and will be transmitted to port 207 of the circulator 220.

As shown in FIG. 4, the negative group delay circuit 200 comprises a resonator 230 with two ports, and the negative group delay circuit 200 also comprises a reflection amplifier 240. One of the ports of the resonator 230 is connected to the port 207 of the circulator 220, and the other port of the resonator 230 is connected to the reflection amplifier 240.

Thus, signals entering the circulator 220 at the port 206 are transmitted to the port 207, where they pass through the resonator 230 and are then reflected from the reflection amplifier 240 back through the resonator 230, and enter the circulator at the port 207, from where they are transmitted to the port 250 of the circulator 220. The port 250 of the circulator 220 is used as output port of the entire negative group delay circuit 200, and is preferably connected to ground via a resistor 245.

A circulator can comprise three or four ports, but in the embodiment 200 of FIG. 4, the circulator 200 is suitably a three-port circulator, although a four-port circulator can also be used, with one of the ports left unused.

Figure 5:
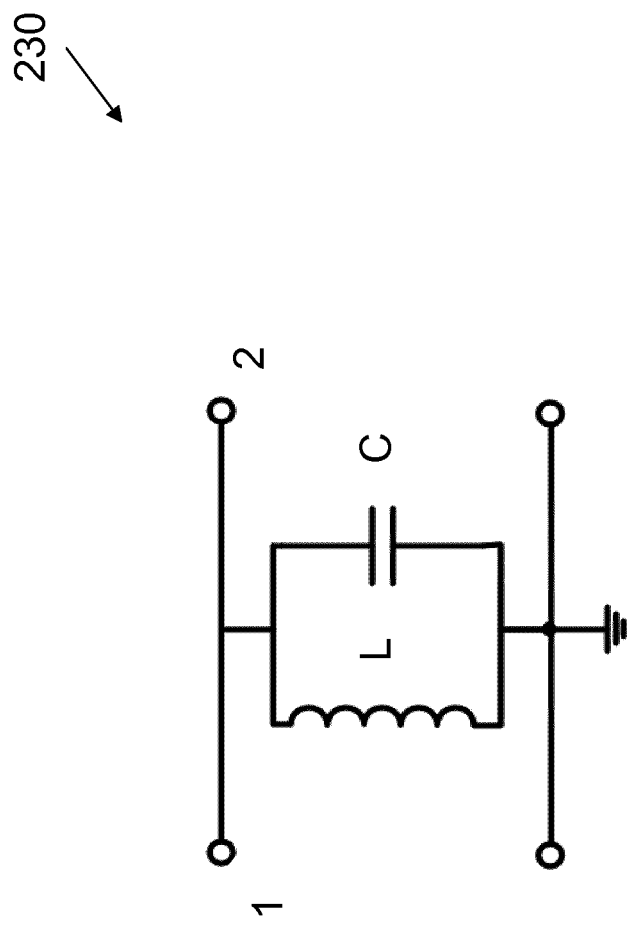
FIG. 5 shows an example of resonator for use in a negative group delay circuit.

Turning now to the resonator 230, an example of an embodiment of such a resonator is shown in FIG. 5: here, the resonator 230 is a two port circuit which comprises an inductor L in parallel with a capacitor C. The two ports of the resonator 230 are indicated by means of numbers in FIG. 5.

Figure 6:
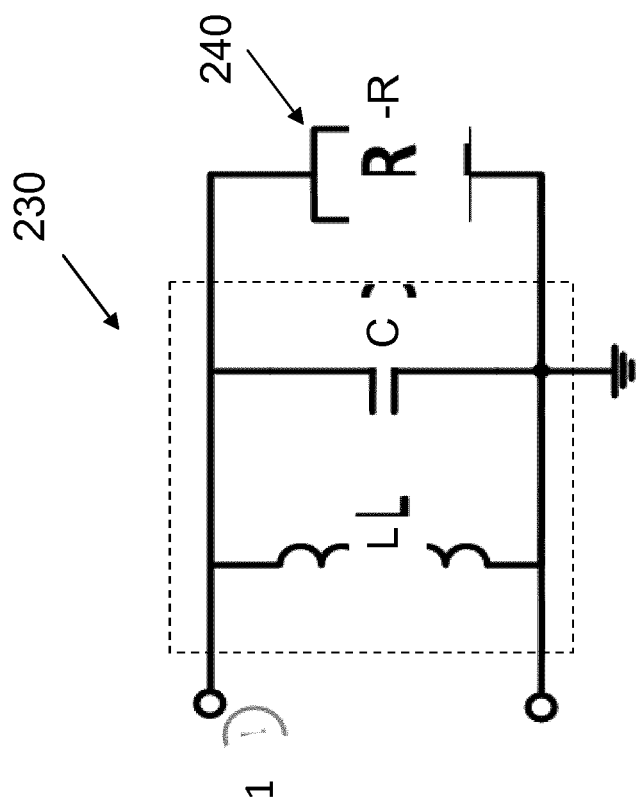
FIG. 6 shows the resonator of FIG. 5 with a reflection amplifier denoted by, and FIGS. 7 and 8 show performance charts of the resonator shown in FIG. 6.

In FIG. 6, an embodiment of the reflection amplifier 240 has been connected at port 2 of the resonator 230, turning the total circuit into a one port circuit. In addition, as indicated in FIG. 6, the reflection amplifier 240 can, in principle, be represented as a negative resistor, denoted as "−R" in FIG. 6, where R is assumed to be a positive value, i.e. R>0Ω.

Figure 7:
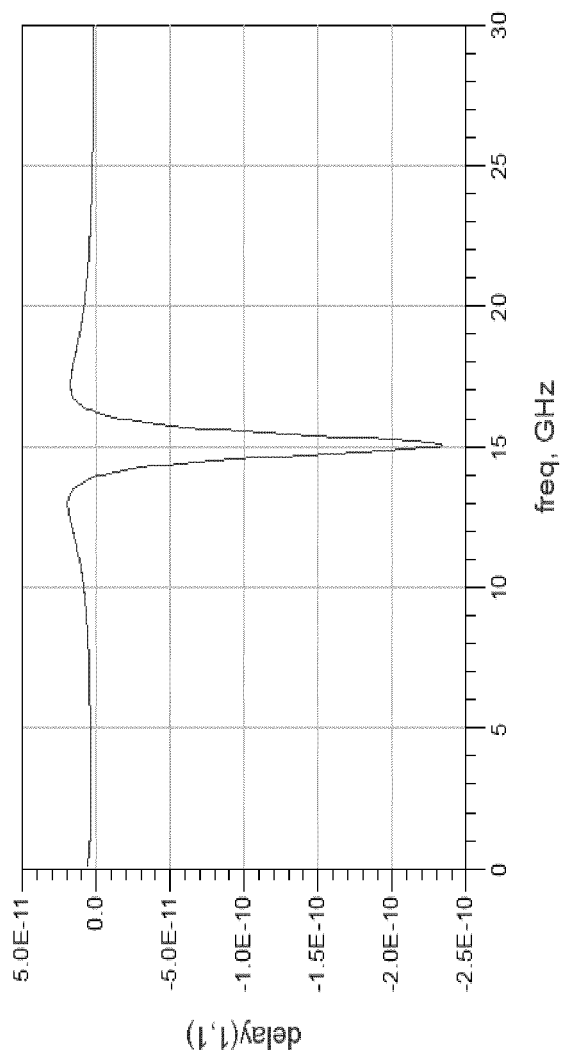
Figure 8:
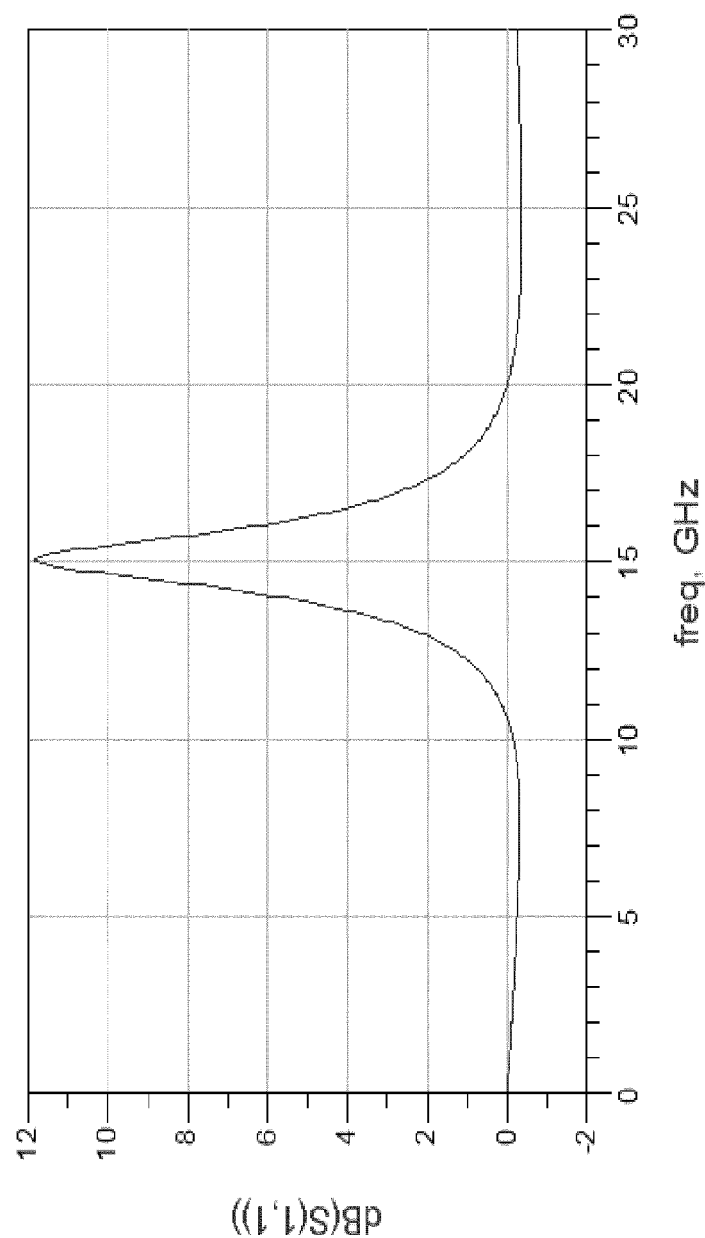

FIGS. 7 and 8 show performance charts of the circuit shown in FIG. 6, using the following values for the components:

L=0.05 nH, C=2.3 pF and R=29Ω, i.e. −R=−29Ω.

FIG. 7 shows the group delay of the circuit, which is essentially identical to that of FIG. 2, i.e. there is a "dip" at about 15 GHz. FIG. 8 shows the reflection coefficient of the circuit, which corresponds to the gain shown in FIG. 3, but has an essentially curved shape, i.e. there is an increase, a "convex" curve shape centered at about 15 GHz, as opposed to the "dip" at 15 GHz of FIG. 3.

Analytical expressions of the reflection coefficient and the group delay at resonance frequencies of the combination of a resonator and a negative reflection amplifier shown in FIG. 6 will now be derived, with the symbol Γ being used to denote the reflection coefficient and GD being used to denote group delay:

$$\Gamma |_{\omega=\omega_0} = \frac{1 + RY_0}{1 - RY_0} \quad (1)$$

$$GD |_{\omega=\omega_0} = \frac{4(-R)^2 Y_0 C}{(-RY_0)^2 - 1} \quad (2)$$

In equations (1) and (2) above, $Y_0$ is the load admittance. A typical value is 20 mS.

From (1) and (2) above, it can be found that, as $|RY_0|<1$, a negative group delay is obtained. The value of the group delay is determined by the negative resistance and by the load admittance/impedance, as well as by the capacitance, and/or inductance, as the case may be. As $|RY_0|$ approaches 1, both the reflection coefficient and group delay variation become large.

Figure 9:
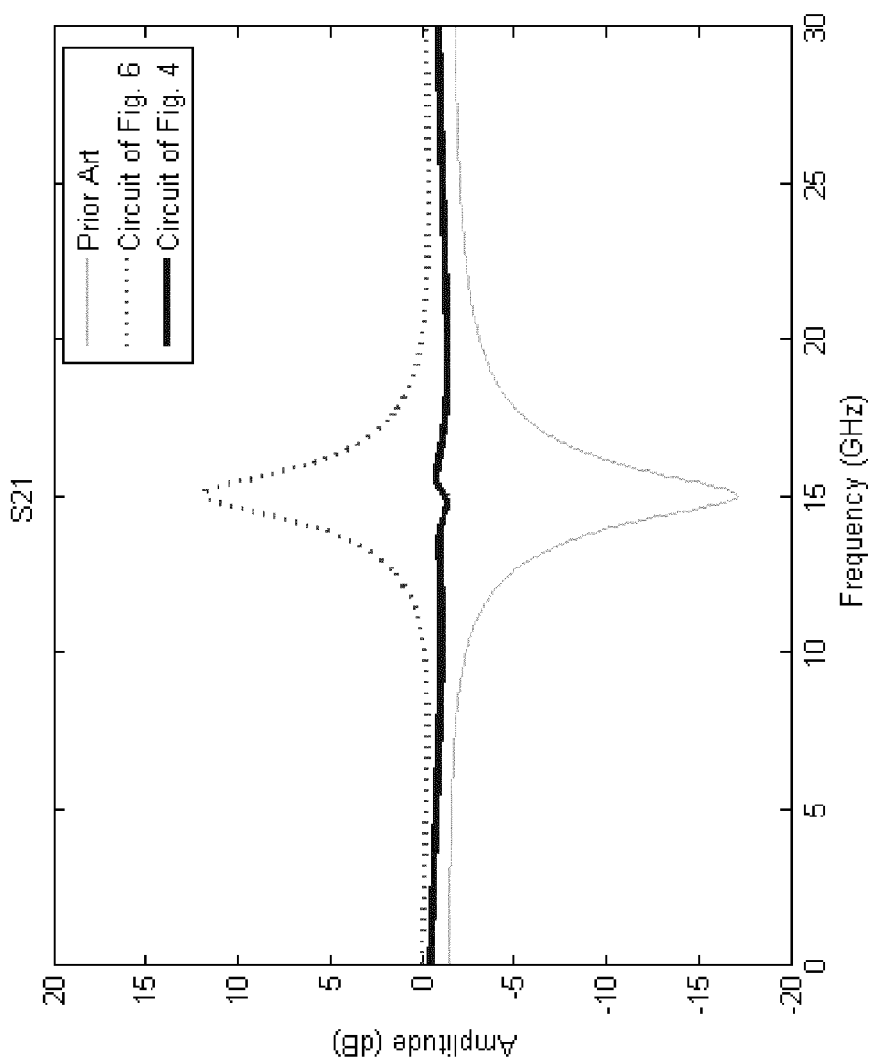
FIG. 9 shows a performance chart for three different circuits.

A circulator such as the one 220 of FIG. 4 will transfer reflected signals from the resonator 230 and the reflection amplifier 240 into a transmission signal at the port 250 of the circulator. In addition, the port 206 of the circulator 220 and the port 207 can be seen as forming a two port circuit. Ignoring the losses of circulator, the gain or transmission coefficient $|S_{21}|$ of this two-port circuit is plotted in FIG. 9, which also shows the gain for a typical prior art negative group delay circuit such as the one of FIG. 1, as well as for the negative group delay circuit 200 of FIG. 4, which comprises both a negative group delay component and the combination of a resonator and a reflection amplifier. From FIG. 9, we see that the negative group delay circuit 200 of FIG. 4 exhibits an almost flat amplitude curve.

Figure 10:
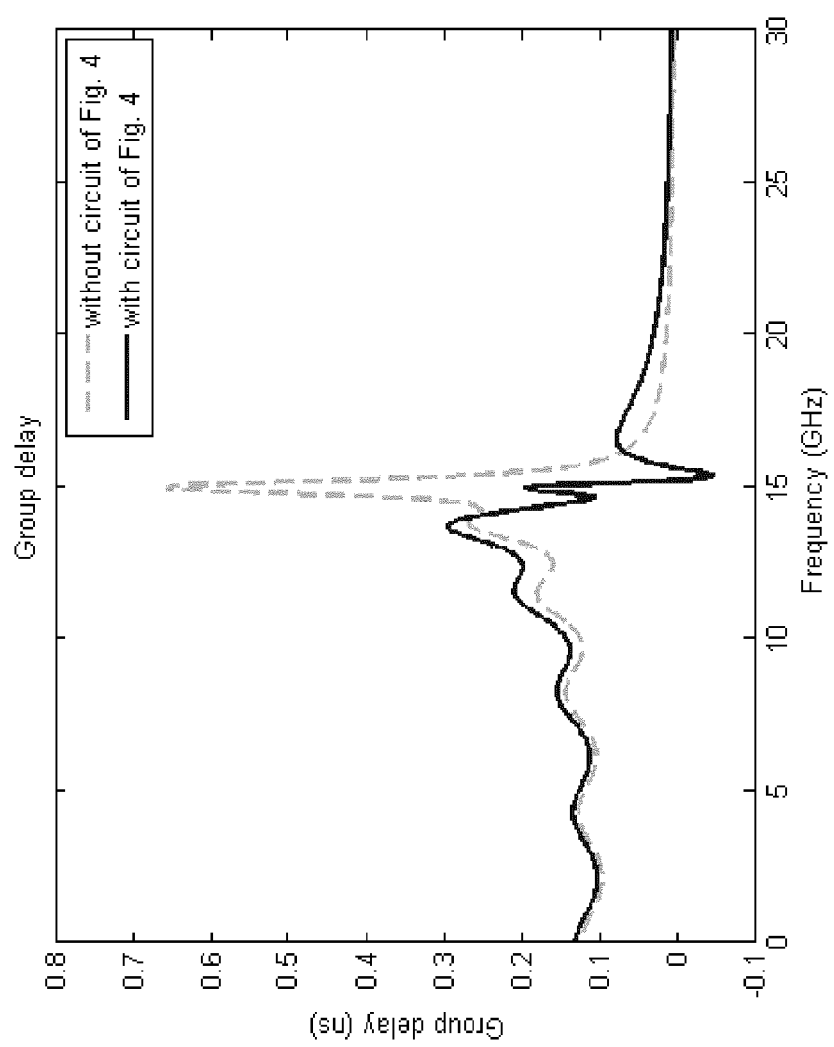
FIGS. 10 and 11 show group delay and gain for a filter with and without the negative group delay circuit of FIG. 4.
Figure 11:
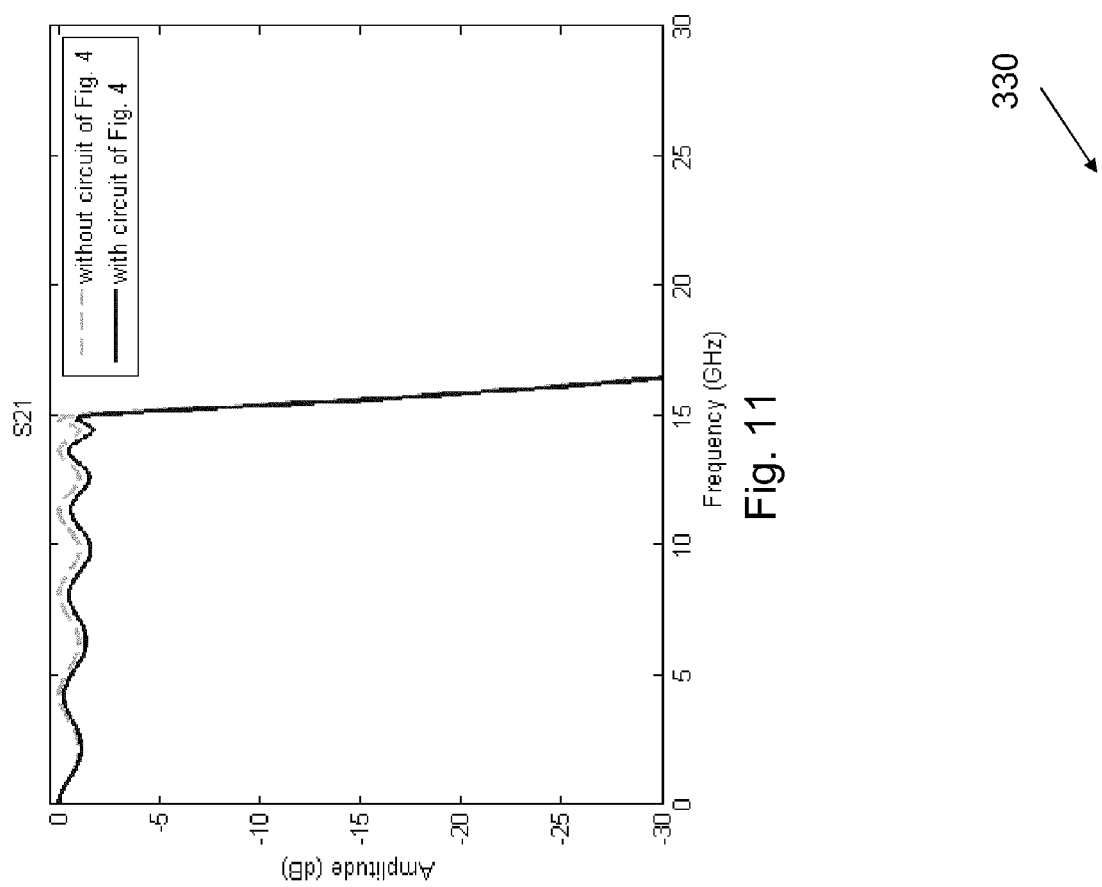

FIGS. 10 and 11 show performance graphs of a low pass filter with a pass band of 0-15 GHz, with and without the use of a negative group delay circuit such as the one 200 shown in FIG. 4. FIG. 10 shows that the group delay variation at the edge of the transition band of the filter is reduced significantly, and the group delay variation is reduced from 0.6 ns to 0.2 ns; while within the pass band of the low pass filter, i.e. 0-15 GHz, the group delay is reduced slightly.

As shown in FIG. 11, the gain is reduced by less than 0.53 dB with the use of the negative group delay circuit 200. In conclusion, with the use of the negative group delay circuit 200, a significant improvement in the filter's group delay is achieved, with only a marginal effect on the gain.

Figure 12:
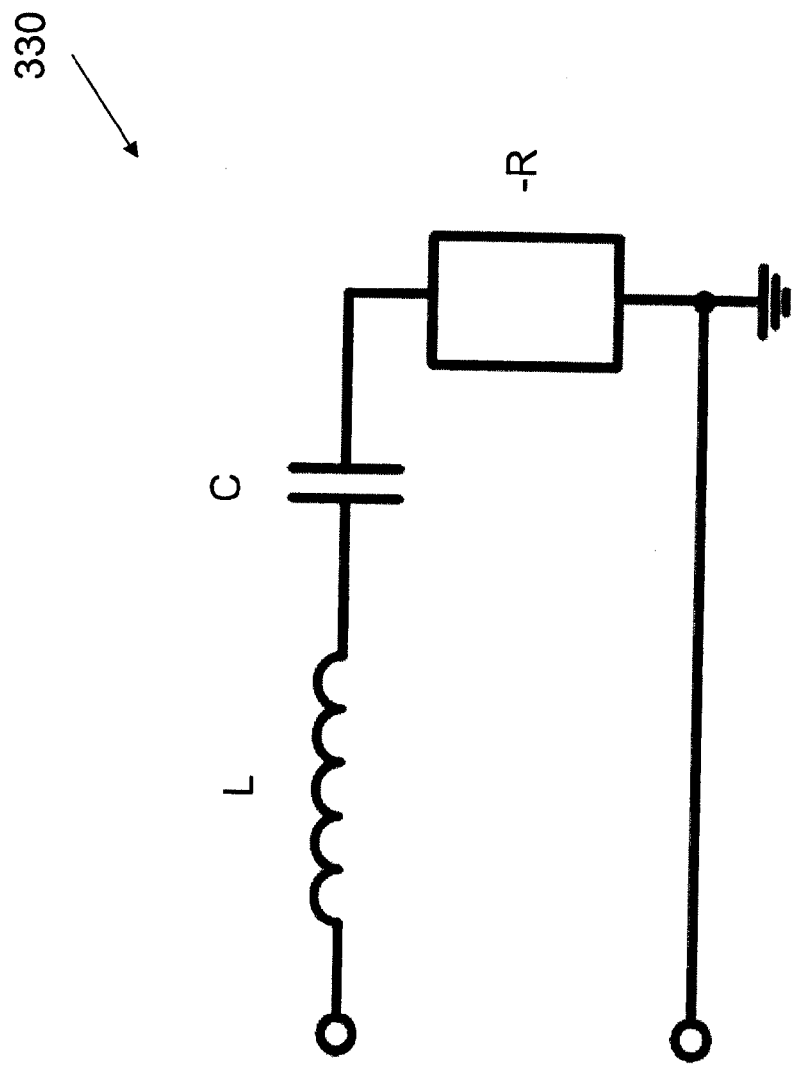
FIG. 12 shows a further example of a resonator for use in a negative group delay circuit.

Returning now to the design of the resonator 230, an alternative to the parallel design shown in FIGS. 5 and 6 is an LC series resonator 330, as shown in FIG. 12, where a negative resistance, i.e. a reflection amplifier is also included, connected in series with the LC-components.

The reflection coefficient, Γ, and the group delay, GD, of an LC circuit can be determined as follows:

$$\Gamma|_{\omega=\omega_0} = \frac{-R-Z_0}{-R+Z_0} \quad (3)$$

$$GD|_{\omega=\omega_0} = \frac{-4LZ_0}{(-R+Z_0)(-R-Z_0)} \quad (4)$$

In equations (3) and (4) above, $Z_0$ is the impedance of the terminal load.

From equations (3) and (4), it can be found that when $|R|>Z_0$, a negative group delay with a "convex" amplitude can be achieved in the embodiment 330, similar to the group delay shown in FIG. 7.

Figure 13:
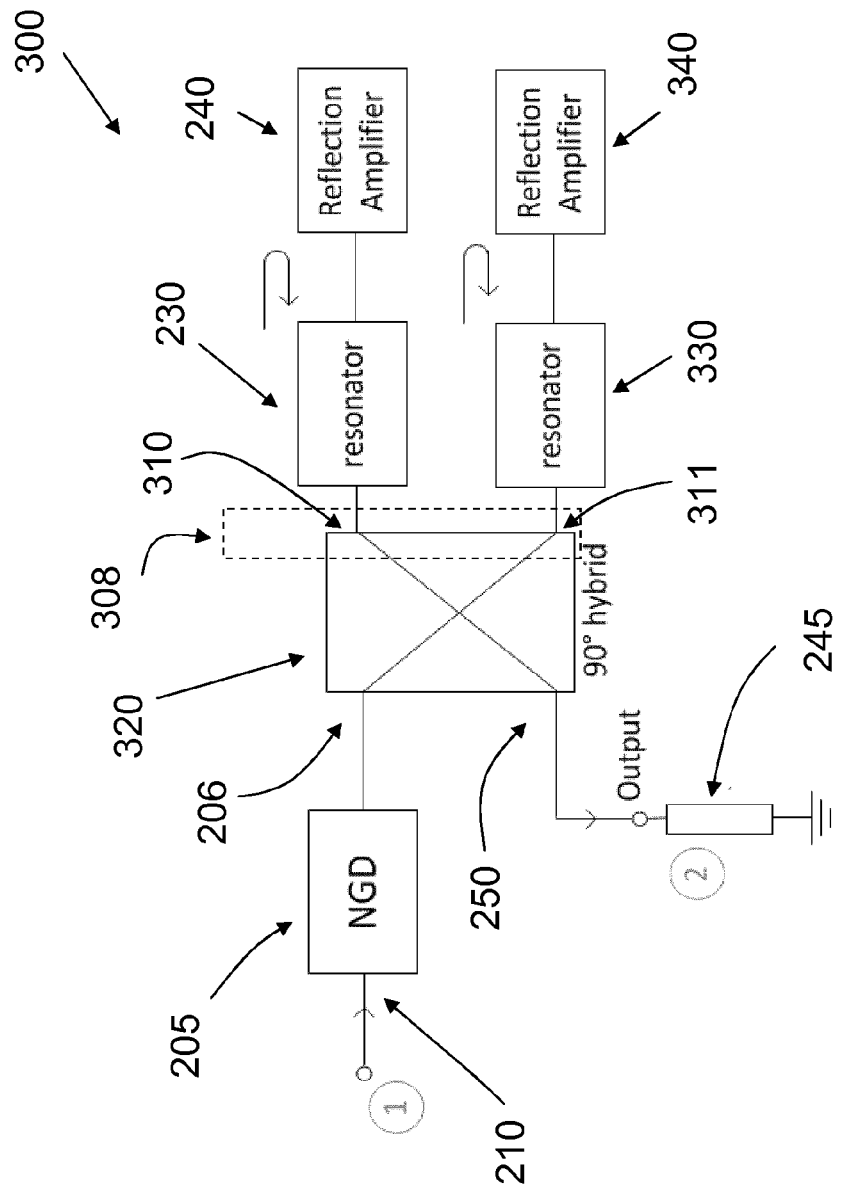
FIG. 13 shows a block diagram of another embodiment of a negative group delay circuit.

The three port circulator in the negative group circuit can, as mentioned above, be realized by means of a three-port microwave circulator, but, as an alternative, a 90° hybrid can be used as a three port-circulator, in a manner which will be described below, with reference to FIG. 13, which shows a negative group delay circuit 300 with a 90° hybrid 320 used as a three port-circulator. In FIG. 13, components which are shown in FIG. 4 have been given the same numbers as in FIG. 4.

A 90° hybrid, also sometimes referred to as a quadrature hybrid, comprises four ports: one input port, one so called isolated port and two output ports.

One of the output ports is the so called direct or transmitted port, and the other output port is the so called coupled port.

In the embodiment shown in FIG. 13, the direct port 310 and the coupled 311 port are both connected to the similar circuits, in this case respective resonators 230, 320 connected in series with respective reflection amplifiers 240, 340. Due to this, the direct port 310 and the coupled port 311 of the 90° hybrid can be seen as a single port 308 in a three port-circulator 320. In embodiments, the two resonators 230, 320 are one and the same resonator to which both of said ports are connected, while, in other embodiments, they are two separate resonators. Likewise, in embodiments, the two reflection amplifiers 240, 340, are one and the same reflection amplifier to which both of said ports are connected, while, in other embodiments, they are two separate reflection amplifiers.

The input port of the quadrature hybrid 320 is used as the input port 206 for the signal from the negative group delay component 205, and the isolated port of the quadrature hybrid 320 is used as the output port 250, i.e. the output port for the entire negative group delay circuit 300, suitably connected to ground via a resistor 245.

Figure 14:
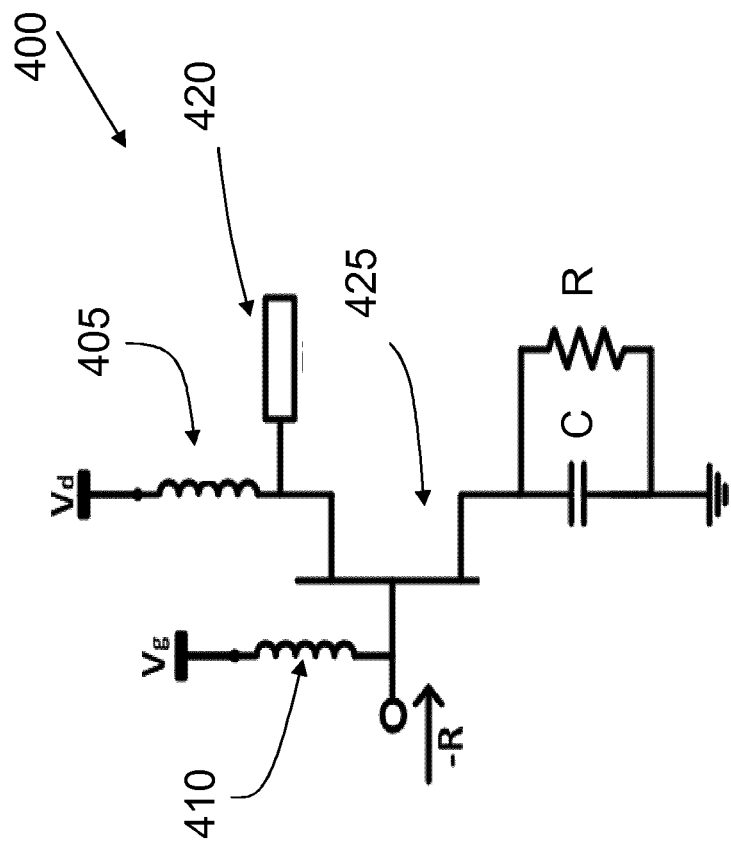
FIGS. 14 and 15 show reflection amplifiers for use in the embodiments of FIGS. 4 and 13.

Turning now to some examples of a reflection amplifier for use in a negative group delay circuit, a first embodiment 400 is shown in FIG. 14: the embodiment 400 is a so called single-ended reflection amplifier, in which a pHEMT transistor 425 is used. The gate and drain are biased through inductor chokes 410, 405. A resistor R at the source of the pHEMT transistor 425 is used to limit the drain current, and a capacitor C at the source of the pHEMT transistor 425 is used to control the negative resistance -R of the single-ended reflection amplifier 400. An open-stub transmission line 425 connected to the drain of the pHEMT transistor 425 is used to select the operational frequency band of the single-ended reflection amplifier 400.

Figure 15:
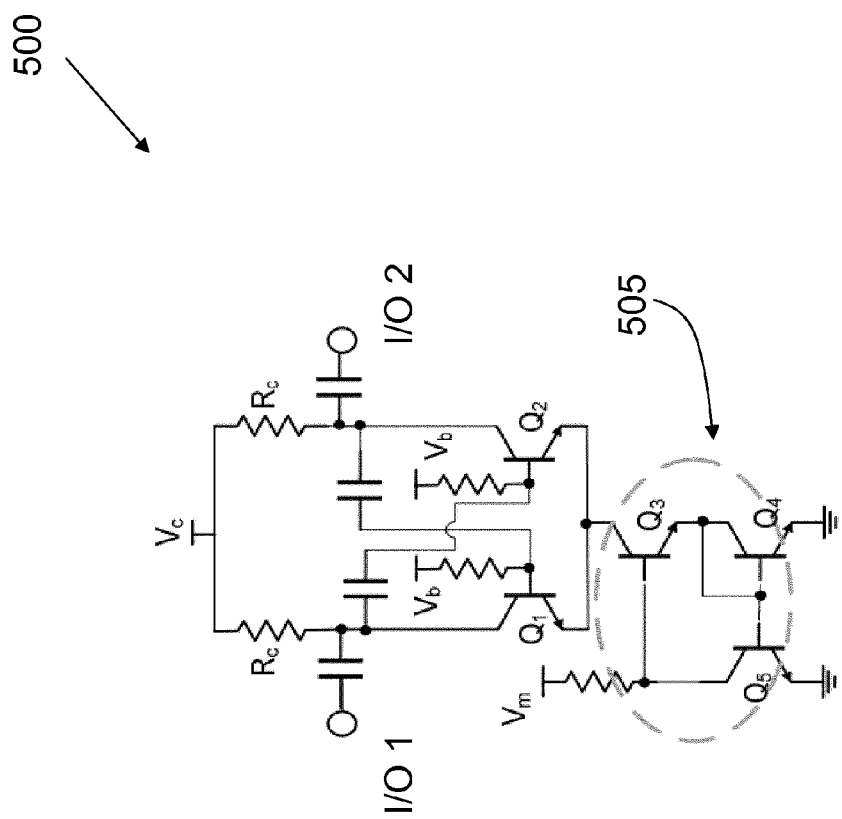

A second embodiment 500 of a reflection amplifier is shown in FIG. 15: this reflection amplifier is a so called balanced reflection amplifier, i.e. there are two input/output ports, shown as 1/O1 and 1/O2 in FIG. 15. The balanced reflection amplifier 500 comprises a current source with transistors Q3, Q4 and Q5. In addition, an emitter coupled pair of transistors Q1 and Q2 is used to amplify input signals, consequently, generate negative resistances.

In the balanced reflection amplifier 500, the negative resistance obtained is a function of a DC current which can be controlled by a bias voltage $V_m$, applied at the collector of transistor Q5, and the base of transistor Q3, as shown in FIG. 15. If $V_m$ increases from 2V to 4V at frequency of 15 GHz, the negative resistance can be varied from $-125\Omega$ to $-60\Omega$.

Figure 16:
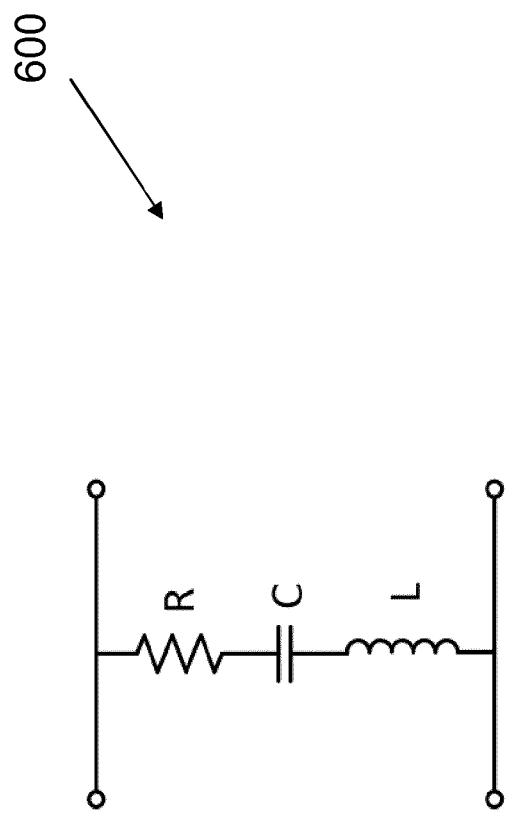
FIG. 16 shows an example of a negative group delay component.

Regarding examples of the negative group delay component for use in the negative group delay circuit, a first example 600 is shown in FIG. 16: here, we see a circuit comprising serially connected R-L-C components.

In addition, the prior art circuit 100 shown in FIG. 1 may also be used as the negative group delay component 205.

In the drawings and specification, there have been disclosed exemplary embodiments of the invention. However, many variations and modifications can be made to these embodiments without substantially departing from the principles of the present invention. Accordingly, although specific terms are employed, they are used in a generic and descriptive sense only and not for purposes of limitation.

The invention is not limited to the examples of embodiments described above and shown in the drawings, but may be freely varied within the scope of the appended claims.

The invention claimed is:

1. A negative group delay circuit comprising a negative group delay component, the negative group delay circuit also comprising a circulator with three ports, with the negative group delay component being arranged between an input port of the negative group delay circuit and a first port in the circulator, said circulator comprising a 90° hybrid with an input port arranged to be said first port of the circulator, said 90° hybrid also comprising an isolated port arranged to be said third port of the circulator and also comprising a direct port and a coupled port, where the direct port and the coupled port are connected to respective resonators, with each resonator being connected in series with respective reflection amplifiers, with the combination of the direct and the coupled port acting as said second port in the circulator, so that signals reflected from the first reflection amplifier to the second port of the circulator through said respective resonators are emitted at the third port of the circulator, which third port is arranged to be used as an output port of the negative group delay circuit.

2. The negative group delay circuit of claim 1, in which said resonators are one and the same resonator, to which both the direct port and the coupled port are connected.

* * * * *